United States Patent
Lee et al.

(10) Patent No.: US 12,063,786 B2
(45) Date of Patent: Aug. 13, 2024

(54) COMPUTE-IN-MEMORY DEVICE AND METHOD

(71) Applicant: Taiwan Semiconductor Manufacturing Company, Ltd., Hsinchu (TW)

(72) Inventors: Chieh Lee, Hsinchu (TW); Chia-En Huang, Hsinchu (TW); Yi-Ching Liu, Hsinchu (TW); Wen-Chang Cheng, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/726,086

(22) Filed: Apr. 21, 2022

(65) Prior Publication Data

US 2023/0022115 A1 Jan. 26, 2023

Related U.S. Application Data

(60) Provisional application No. 63/225,222, filed on Jul. 23, 2021.

(51) Int. Cl.
*H10B 51/20* (2023.01)
*G11C 5/04* (2006.01)
(Continued)

(52) U.S. Cl.
CPC .............. *H10B 51/20* (2023.02); *G11C 5/04* (2013.01); *G11C 5/063* (2013.01); *G11C 11/223* (2013.01); *G11C 11/2273* (2013.01); *H10B 51/10* (2023.02); *H10B 51/30* (2023.02); *H10B 51/40* (2023.02); *G11C 11/2255* (2013.01); *G11C 11/2257* (2013.01)

(58) Field of Classification Search
CPC ........ H10B 51/20; H10B 51/10; H10B 51/30; H10B 51/40; G11C 5/04; G11C 5/063; G11C 11/223; G11C 11/2273; G11C 11/2255; G11C 11/2257; G11C 11/2259; G11C 11/54
USPC ......................................................... 365/145
See application file for complete search history.

(56) References Cited

U.S. PATENT DOCUMENTS 10,741,247 B1 * 8/2020 Yeh ........................ H10B 43/40
2019/0319044 A1 * 10/2019 Harari .................... H10B 43/35
(Continued)

FOREIGN PATENT DOCUMENTS

TW 202101254 A 1/2021
WO WO-2020263340 A1 * 12/2020 ........... G11C 11/223

*Primary Examiner* — Fernando Hidalgo
(74) *Attorney, Agent, or Firm* — Merchant & Gould P.C.

(57) ABSTRACT

In some embodiments, an integrated circuit (IC) device includes an active semiconductor layer, a circuitry formed within the active semiconductor layer, a region including conductive layers formed above the active semiconductor layer, and a memory module formed in the region. The memory device includes a three-dimensional array of memory cells, each adapted to store a weight value, and adapted to generate at each memory cell a signal indicative of a product between the stored weight value and an input signal applied to the memory cell. The memory module is further adapted to transmit the product signals from the memory cell simultaneously in the direction of the active semiconductor layer.

20 Claims, 13 Drawing Sheets

(51) Int. Cl.
   *G11C 5/06*    (2006.01)
   *G11C 11/22*   (2006.01)
   *H10B 51/10*   (2023.01)
   *H10B 51/30*   (2023.01)
   *H10B 51/40*   (2023.01)

(56) References Cited

U.S. PATENT DOCUMENTS

| | | |
|---|---|---|
| 2020/0202204 A1 | 6/2020 | Kouno et al. |
| 2021/0118488 A1 | 4/2021 | Kim et al. |
| 2021/0327481 A1* | 10/2021 | Kasai ............... G11C 16/26 |
| 2021/0376844 A1* | 12/2021 | Wang ............... H03M 1/1265 |
| 2022/0139952 A1* | 5/2022 | Kim ............... H10B 41/27 |
| | | 257/314 |
| 2022/0277792 A1* | 9/2022 | Yun ............... H10B 43/27 |
| 2022/0343975 A1* | 10/2022 | Chevallier ......... G11C 13/0069 |
| 2022/0398439 A1* | 12/2022 | Zhang ............... G11C 16/10 |

* cited by examiner

600

- Storing weight values, one in each of a respective one of a plurality of memory cells formed at least partially within a set os conductive layers above an active semicondustor layer in an integrated circuit device, the memory cells being arranged in columns sequentially disposed in a first (x) dimension, columns sequentially disposed in a second (y) dimension, and sequentially disposed levels in a third (z) dimension substantially perpendicular to the active semiconductor layer — 610

- Applying input signals, each indicative of an input value, to respective memory cells — 620

- Generating output signals from the memory cells, the output signal from each of the memory cells being indicative of a combination of the input values and respective weight values stored in the memory cell — 630

- Transmitting the output signals to the active semiconductor layer — 640

FIG. 6

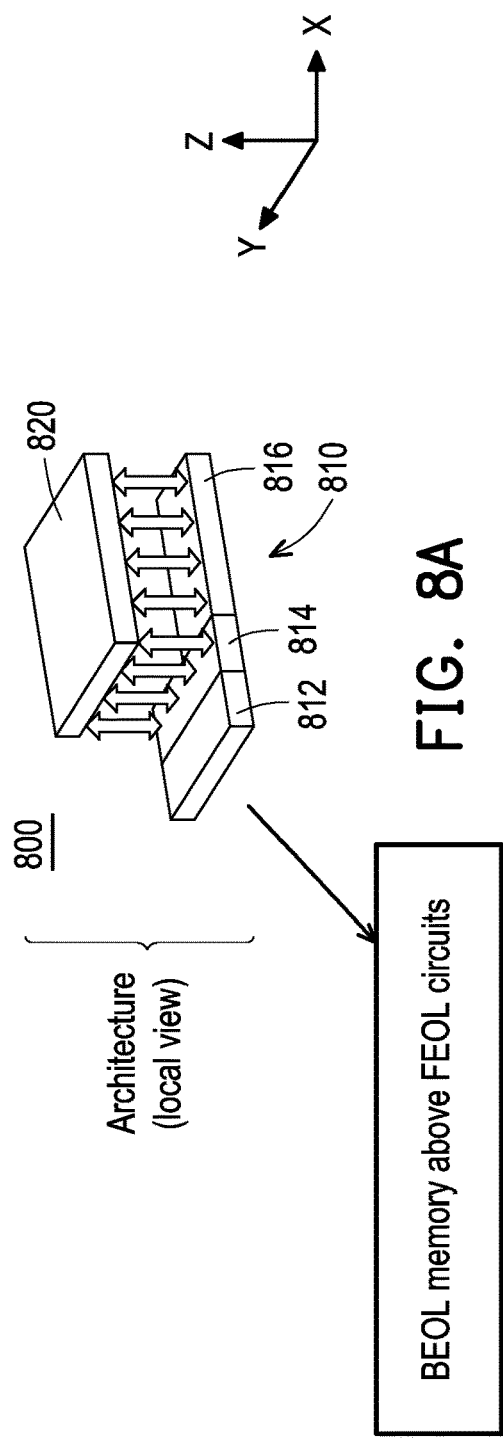
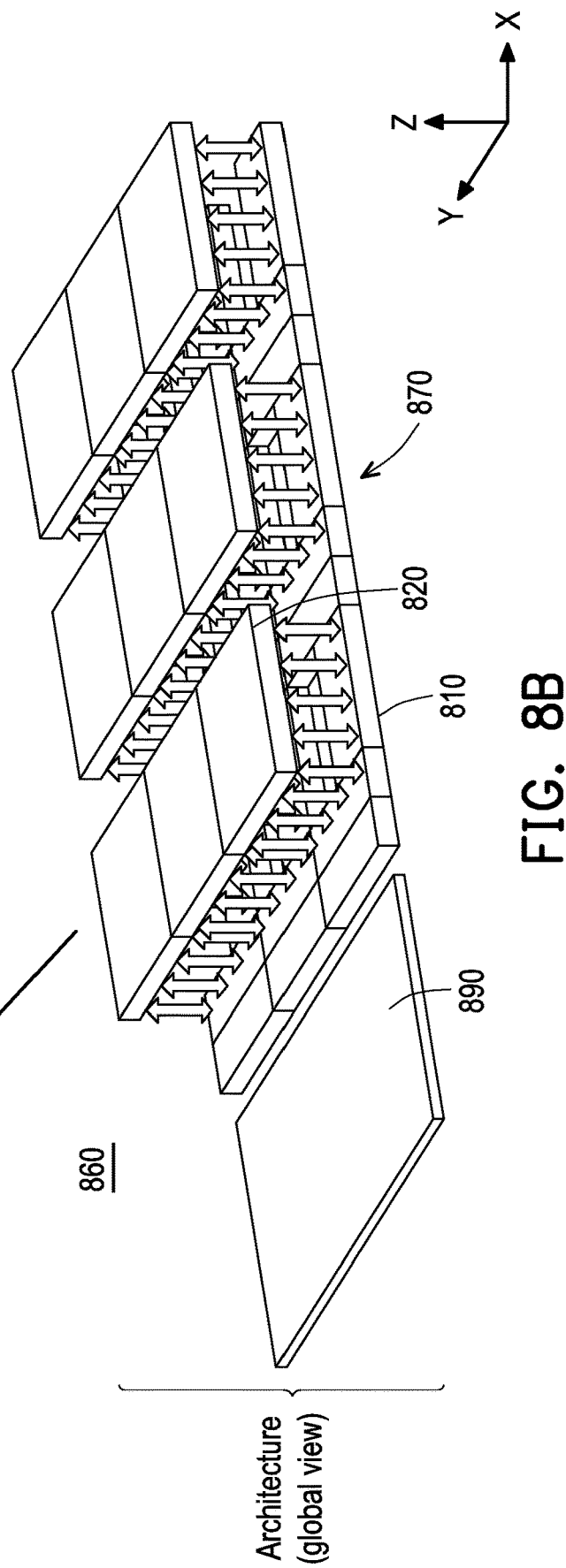

COMPUTE-IN-MEMORY DEVICE AND METHOD

CROSS REFERENCE TO RELATED APPLICATION

This application claims the benefit of U.S. Provisional Application No. 63/225,222, filed Apr. 21, 2022, which is incorporated herein by reference.

BACKGROUND

This disclosure relates generally to in-memory computing, or compute-in-memory ("CIM"), and more specifically relates to memory arrays used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 shows a schematic block diagram of a 2D array of 3D memory array modules positioned above a 2D array of the respective FEOL circuits according to some embodiments.

FIG. 8A schematically shows a back-end-of-line (BEOL) two-dimensional (2D) memory array module positioned above a corresponding front-end-of-line (FEOL) circuits according to some embodiments.

FIG. 8B schematically shows a two-dimensional (2D) array of 2D memory array modules positioned above a 2D array of the respective FEOL circuits according to some embodiments.

DETAILED DESCRIPTION

Figure 1:
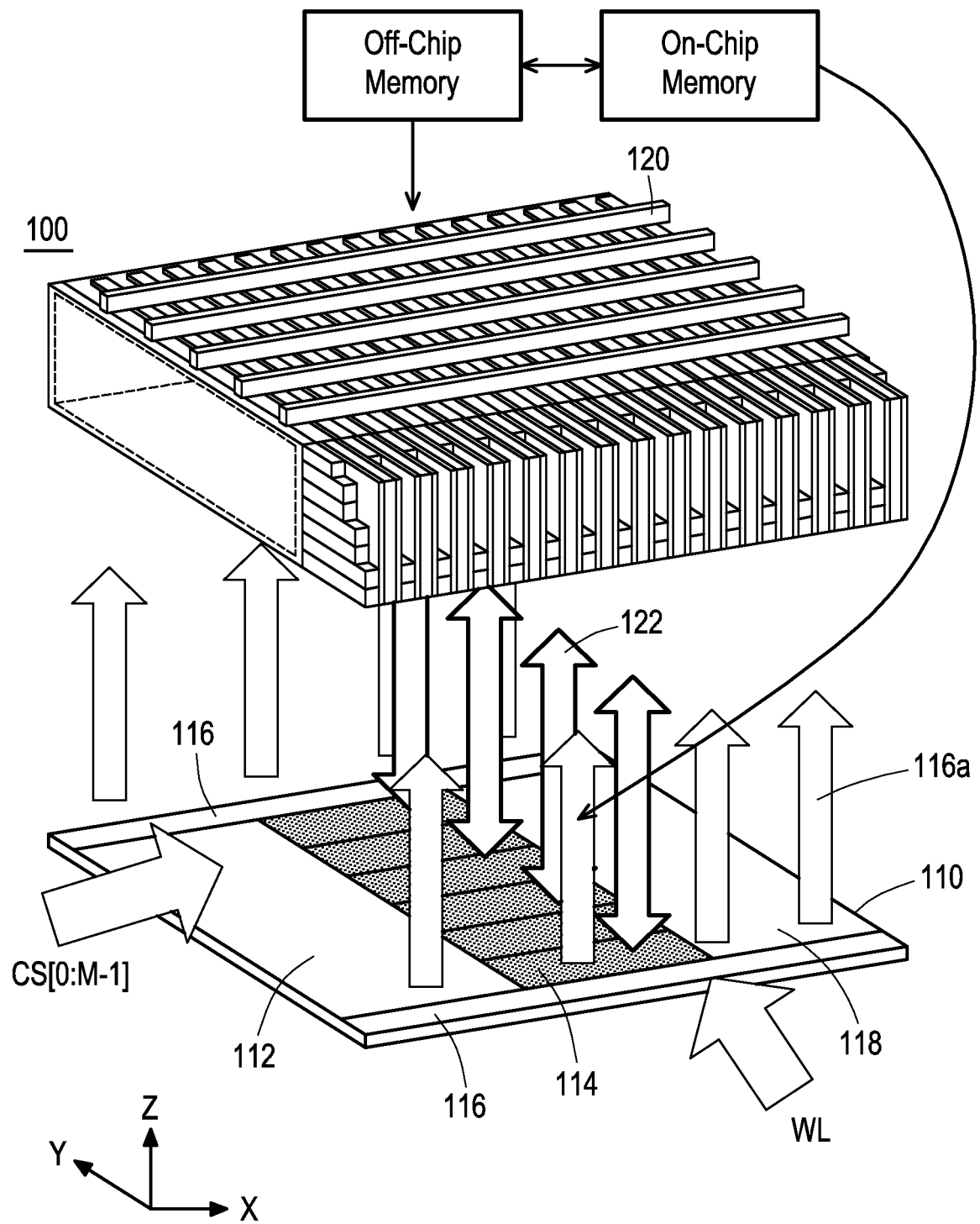
FIG. 1 schematically shows a back-end-of-line (BEOL) three-dimensional (3D) memory array module positioned above a corresponding front-end-of-line (FEOL) circuits according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates generally to in-memory computing, or compute-in-memory ("CIM"), and more specifically relates to memory arrays used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. In certain conventional CIM systems, as computational speeds increase, data transfer rates are increasingly becoming a more significant factor in limiting overall processing speed, idle times for processors increased, as processors wait for data to be fetched from memory. The transfer of data not only adds to the computational latency, but the associated power dissipation is a major issue. In order for large-scale computational systems, such as convolutional neural networks ("CNNs") to run in real-time on resource-constrained systems, it is advantageous to simplify/approximate MAC units because they are usually responsible for significant area, power and latency costs.

In some embodiments, a computing device includes a memory module, a set of data input lines, a set of weight input lines and a set of output lines. The memory module in some embodiments includes memory cells arranged in a three-dimensional array extending in a first (x), second (y) and third (z) dimension. Each memory cell is connected to one of the weight input lines (such as a word line (WL), one of the input lines (such as a source line (SL)), and one of the output lines (such as a bit line (BL). In some embodiments, the WLs extend in the second dimension and are distributed in the first and third dimensions; the BLs and SLs extend in the third dimension and distributed in the second and third dimensions. In some embodiments, each of the memory cells includes a one-transistor (1T) memory cell, such as a 1T ferroelectric random-access memory (FeRAM) element. In some embodiments, the memory module is adapted to store in each memory cell a weight value transmitted from the respective weight input lines, receive input signals from the input lines, and simultaneously output signals to the BLs. In some embodiments, the computing device further includes a circuitry extending in the first and second dimensions, disposed below the memory module in the third dimension, and adapted to receive from the memory module signals relating to the signals outputted to the BLs.

In some embodiments, the circuitry is disposed in an active semiconductor layer (sometimes referred to as the "front end of the line" (FEOL)) of an integrated circuit (IC) device, and the memory module is disposed in metal layers (sometimes referred to as the "back end of the line" (BEOL)) of the IC device.

In some embodiments, a method of in-memory computing includes: storing the weight values in respective memory cells in a BEOL region of an integrated circuit device and arranged in a three-dimensional array, in which the memory cells forming one-dimensional arrays arranged in rows and columns in a first and second dimension, and extending in a third dimension; applying input signals, each indicative of an input value, to respective memory cells in the three-dimensional array; and simultaneously outputting from the one-dimensional arrays to respective receiving circuits in an FEOL region of the integrated circuit signals, each of which being indicative of a combination (such as a product) of the input values and respective weight values for the respective one-dimensional array.

In some embodiments, such as the example shown FIG. 1, an integrated circuit device 100 includes an active semiconductor region 110, which can be an active layer in a semiconductor substrate and include one or more semiconductor devices, such as sense amplifiers. This region is sometimes referred to as the "front end of the line," or "FEOL," region of the integrated circuit device 100. The integrated circuit device 100 further includes a three-dimensional ("3D") memory array modules (sometimes referred to as "memory array tiles" ("MATs")) 120 formed above the active semiconductor region 110. The 3D memory array modules 120 in this example are formed in a region sometimes referred to as the "back end of the line," or "BEOL," region, at levels where the metal lines for the integrated circuit device are formed. Such memory arrays are sometimes also referred to as "off-chip memory." In some examples, the 3D memory array 120 includes memory cells, which in some embodiments are one-transistor ("1T") memory cells, such as ferroelectric random-access memory ("FeRAM") cells.

Figure 2:
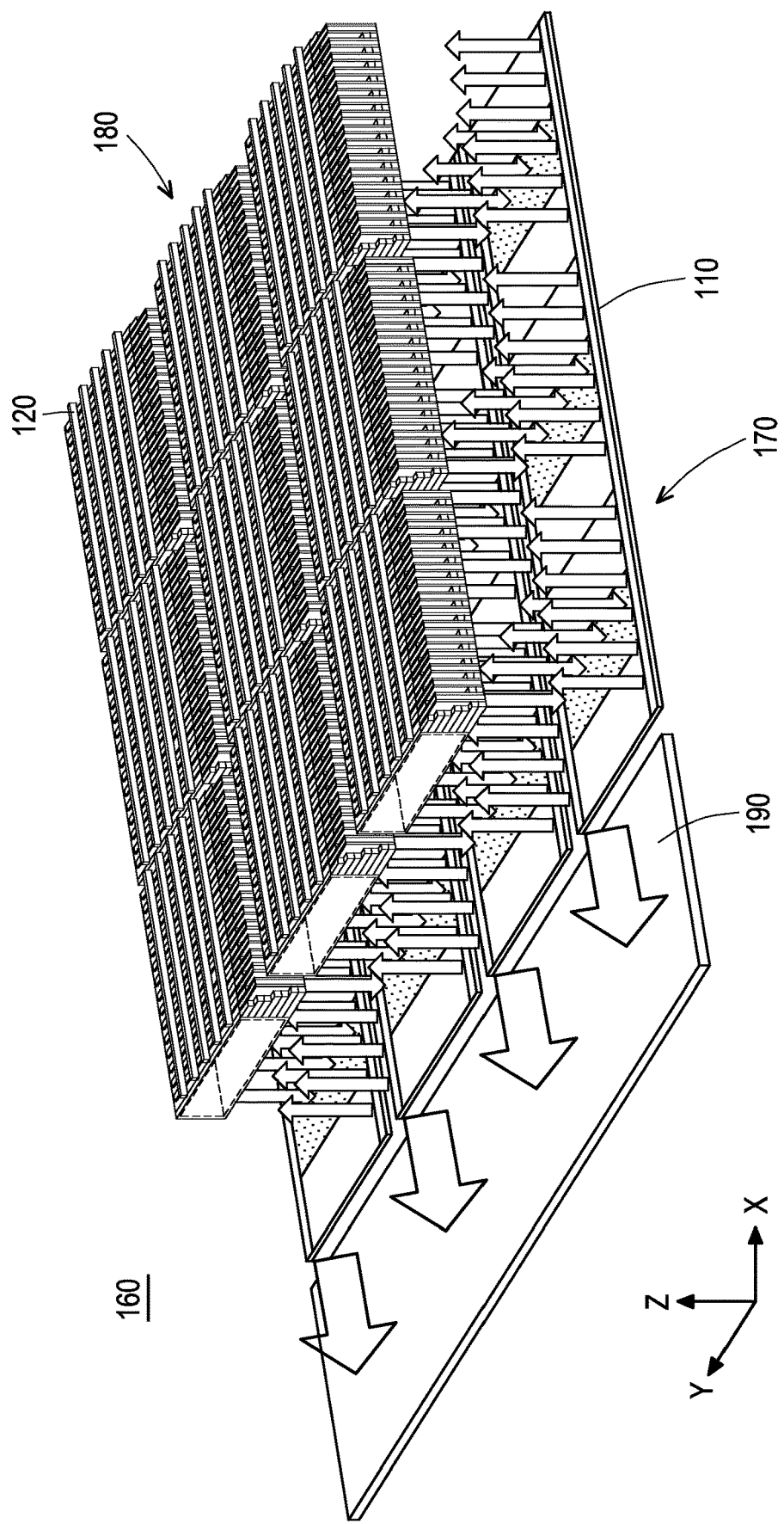
FIG. 2 schematically shows a two-dimensional (2D) array of 3D memory array modules positioned above a 2D array of the respective FEOL circuits according to some embodiments.

In some embodiments, such as the example shown in FIG. 2, an integrated circuit device 160 includes a two-dimensional array 170 of the active semiconductor regions 110 arranged in rows and columns, and a corresponding two-dimensional array 180 of the 3D memory array modules 120. Each actively semiconductor region in the array 170 can be, for example, one or more standard cells in an integrated circuit. The integrated circuit device 160 in this example further includes one or more analog-to-digital converters 190, with inputs from the semiconductor devices in columns of the active semiconductor regions 110.

In some embodiments, as further shown in the example in FIG. 1, the active semiconductor region 110 under the corresponding 3D BEOL memory array module 120 includes a variety of semiconductor circuits, including a sense amplifier controller 112, sense amplifiers 114, word line (WL) drivers 116, and other circuits 118 such as one or more ADCs. As explained in more detail below, in some embodiments the WL drivers 116 are used to select weight values (binary 0 or 1) for the memory cells in the memory array module 126, and the outputs from the one-dimensional arrays of memory cells in the memory array module 120 are received by the sense amplifiers 114 when a column-select CS signal $CS_{mn}$ (where m ranges from 0 to M−1, and n from 0 to N−1 (the ranges denoted as "CS[0:M−1][0:N−1]" in FIG. 2)) is sent to the SA. In some embodiments, the active semiconductor region 110 also include on-chip memory (not shown). In this example, the semiconductor circuits 112, 114, 116, 118 are arranged in the two-dimensional plane, i.e., the x-y plane. Data are read from the one-dimensional arrays of memory cells and memory array module 120 and transmitted to the sense amplifiers 114, and written to the memory array module 120, in the z-direction, i.e., perpendicular to the active semiconductor layer 110 (data flow indicated by the bidirectional arrows 122). WL signals are transmitted from the WL drivers 116 to the memory module 120 in the z-direction (data flow indicated by up-arrows 116a).

Figure 3:
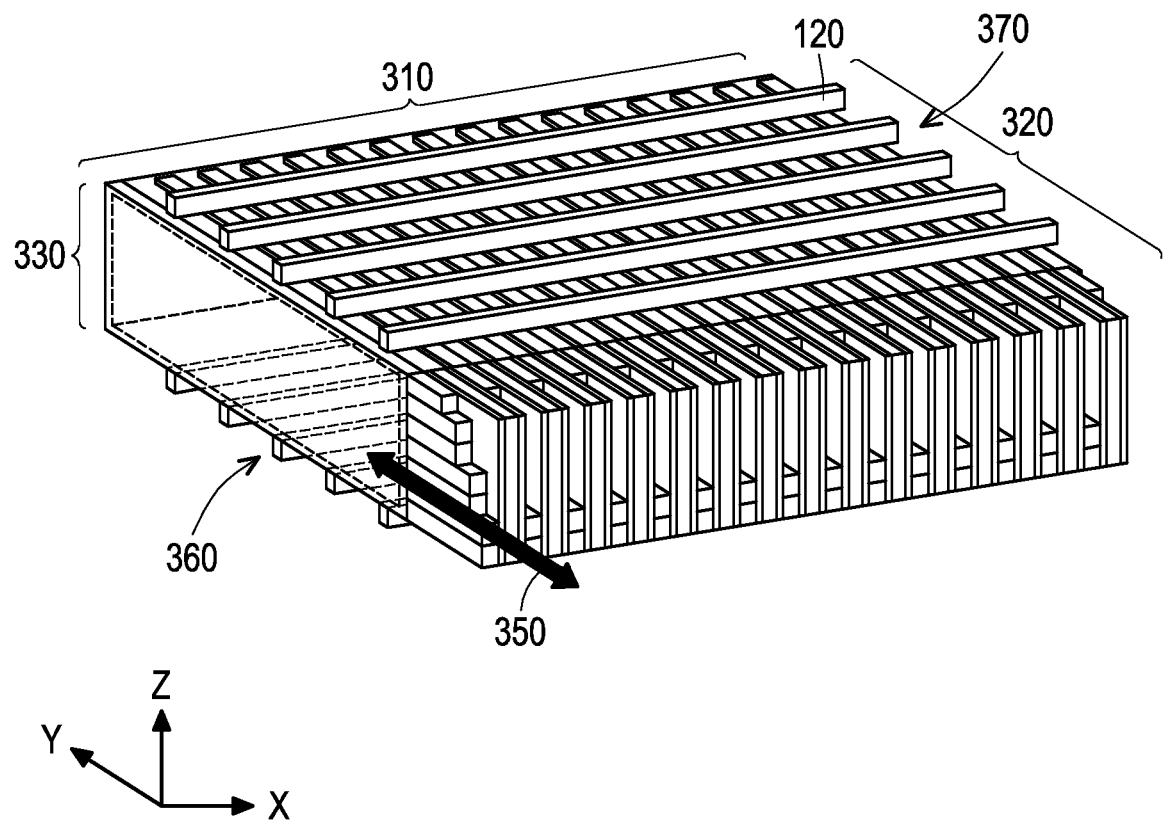
FIG. 3 schematically shows a BOEL 3D memory array module according to some embodiments.

More specifically regarding the 3D BOEL memory array module 120, in some embodiments, such as the example shown in FIG. 3, the module 120 includes memory cells arranged in rows 310, columns 320, and layers 330 in a three-dimensional array. The 3D BOEL memory array module 120 includes word lines 350 extending in the y-direction and spaced apart from each other in the z-direction by an insulator. The 3D memory array module 120 in this example further includes a first group of bit lines (BLs) or source lines (SLs) 360 at the bottom of the memory array module 120. The 3D memory array module 120 in this example further includes a second group of bit lines (BLs) or source lines (SLs) 370 at the top of the memory array module 120. The BLs/SLs 360, 370 in this example extend in the x-direction and are spaced apart from each other in the y-direction within each group (bottom 360 or top 370).

Figure 4:
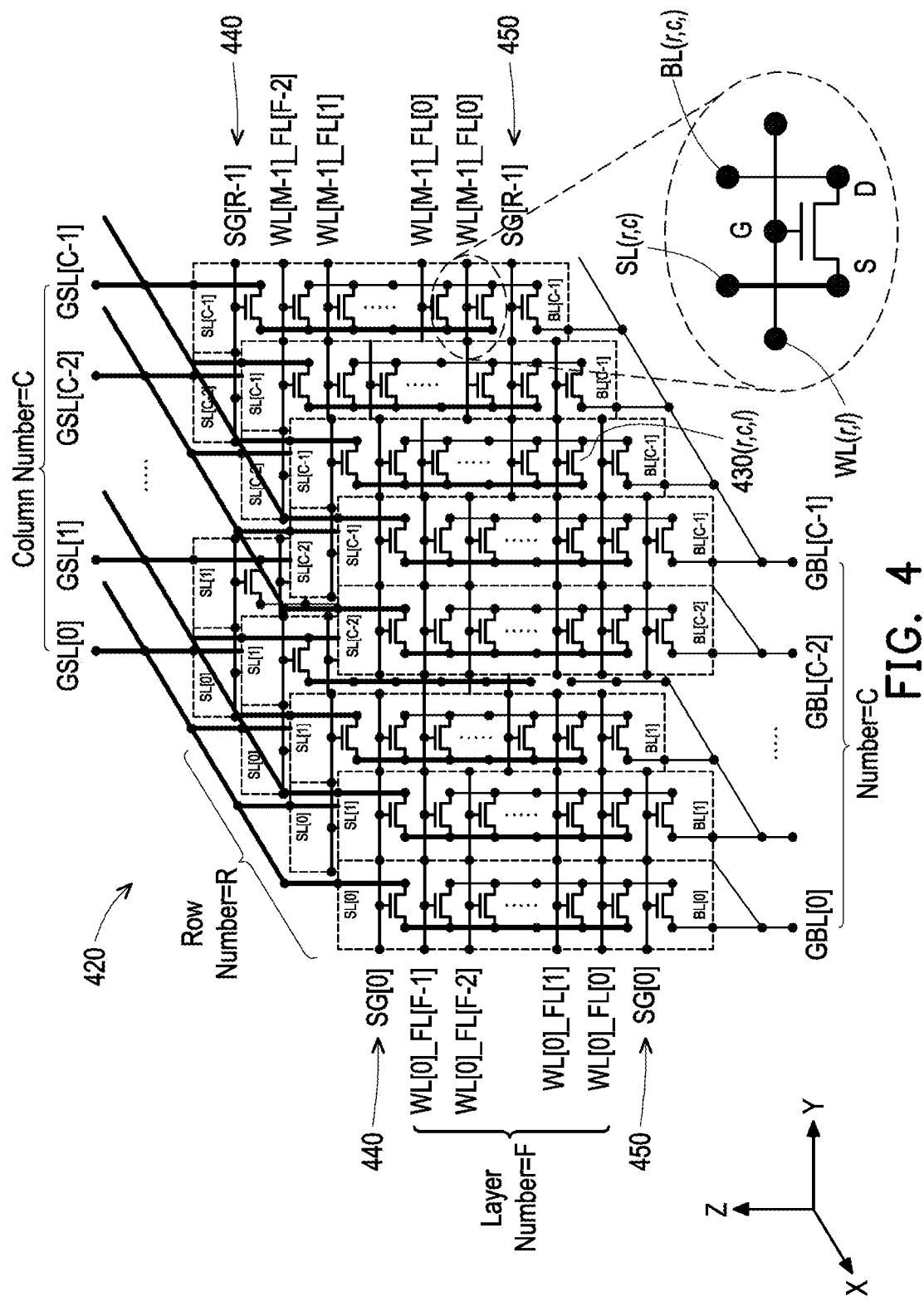
FIG. 4 schematically shows memory cells and their interconnections in a BOEL 3D memory array module according to some embodiments.

In some embodiments, such as the example shown in FIG. 4, a three-dimensional memory array module 420, which is one example of the three-dimensional memory array module 120, includes memory cells 430 arranged in rows, columns, and layers. Each memory cell 430(r, c, l) is identified by its location it occupies in the three-dimensional array; i.e., by the row (r), column (c), and layer (l) the memory cell is located. In the example shown in FIG. 4, r ranges from 0 to R−1, c ranges from 0 to C−1, and l ranges from 0 to F−1, where R, C, and F are integers. In some embodiments the memory cells 430 are single-transistor ("1T") memory cells, such as ferroelectric random-axis memory ("FeRAM") cells. As shown in FIG. 4, such 1T memory cells in some embodiments have gate (G), source (S), and drain (D), with a ferroelectric material in the gate insulation layer. The polarization of the gate insulation layer can be switched by applying a voltage above a threshold voltage between the gate on the one hand, and source and drain on the other. The polarization state of the ferroelectric layer represents the stored value (binary 0 or 1) and determines the source-drain resistance. When the transistor 430 is subsequently turned on (by a gate-source or gate-drain voltage sufficient to turn transistor 430 on but below the threshold voltage), the stored value is sensed by the source-drain current, i.e., a high current corresponds to a low resistance (e.g., 1), and a low current corresponds to a high resistance (e.g., 0). The gate of each memory cell 430 is connected to a word line WL(r, l); the source of each memory cell 430 is connected to a source line SL(r, c); and the drain of each memory cell 430 is connected to a bit line BL(r, c). The memory cells 430 in the same row (r) and layer (l) share the same word line WL(r, l) (also labeled as WL(r)_FL(l) in FIG. 4); the memory cells 430 in the same row (r) and column (c), i.e., in the same one-dimensional array in the z-direction, share the same source line SL(r, c) and a bit line BL(r, c).

The three-dimensional memory array module 420 in the example shown in FIG. 4 further includes switching transistors 440 arranged in a two-dimensional array (R×C in this example) above the memory elements 430, and switch transistors 450 arranged in a two-dimensional array (R×C in this example) below the memory elements 430. Each switch transistor 440(r, c) switchably connects the select line SL(r, c) for the memory elements 430(r, c) in the one-dimensional array at row r and column c to a select line SL(c); the select lines SL(c) for all one-dimensional arrays in column c are connected to a common global select line GSL(c). Likewise, each switch transistor 450(r, c) switchably connects the bit line BL(r,c) for the memory elements 430(r, c) in the one-dimensional array at row r and column c to a bit line BL(c); the bit lines SL(c) for all one-dimensional arrays in column c are connected to a common global bit line GBL(c). The gates of all switch transistors 440(r) in the same row r are connected to a common select gate line SG(r); applying an ON signal to the select gate line SG(r) thus connects all select line SL(r) in the same row r and all columns c to their respective global select lines GSL(c). Likewise, the gates of all switch transistors 450(r) in the same row r are connected to a common select gate line SG(r); applying an ON signal to the select gate line SG(r) thus connects all bit line BL(r) in the same row r and all columns c to their respective global bit lines GBL(c). In some embodiments, the top and bottom select gate lines SG(r) for each row r are connected to each other or supplied with identical signals. In such a case, the select line SL(r, c) for each one-dimensional array located at row r and column c is connected to, or disconnected from, the respective global select line GSL(r) for the row r at the same time as the bit line BL(r, c) for the same one-dimensional array is connected to, or disconnected from, the respective global bit line GBL(r) for the row r. In some embodiments, each global bit line GBL(c) is connected to a respective sense amplifier ("SA") in the active semiconductor region (110 in FIG. 1).

Figures 5A, 5B:
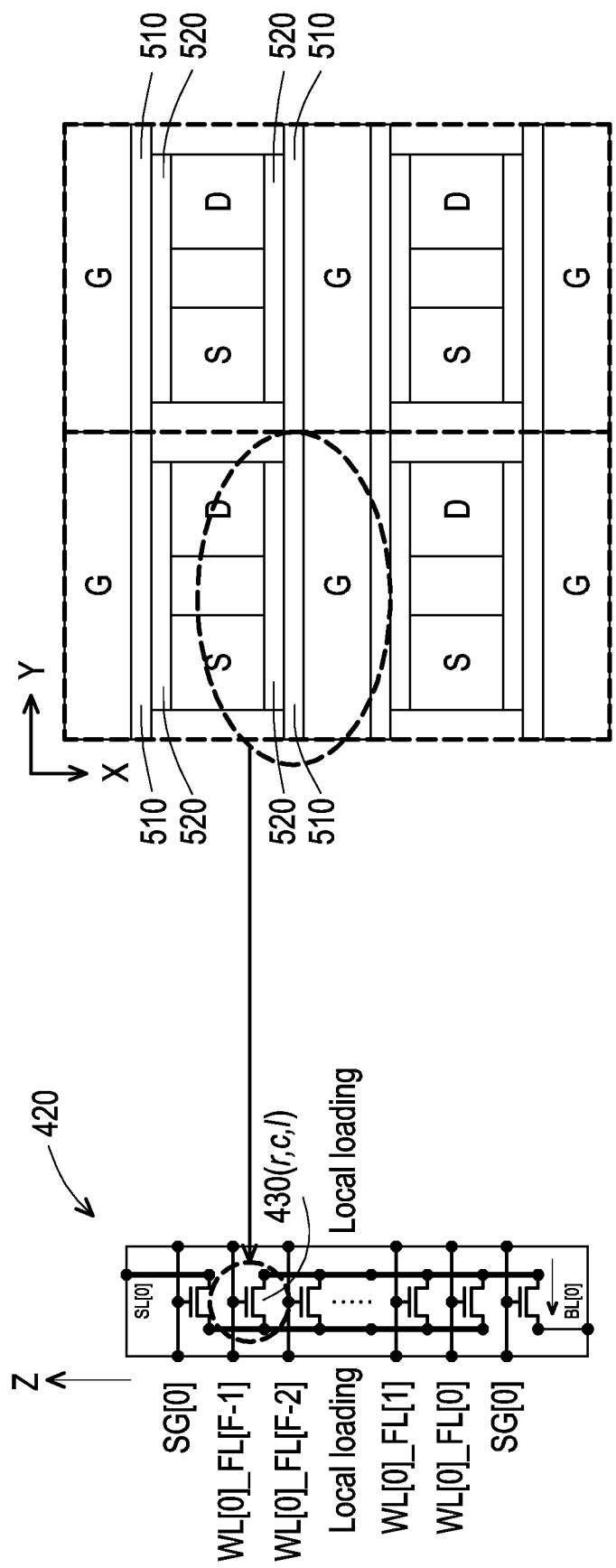
FIG. 5A schematically shows the memory cells in a given column and row of a 3D memory array module according to some embodiments.
FIG. 5B schematically shows the physical structure of a portion of the memory cells shown in FIG. 5A.

In some embodiments, as shown in FIGS. 5A and 5B, the memory cells 430 are formed in the metal layers, i.e., BEOL, above the active semiconductor region. In this example, each single-transistor memory cell 430 includes a stacked structure including, in sequence, a gate G (or WL), a gate oxide/isolation layer 510, a transistor channel layer 520, and a source (S (or SL))/drain (D or (DL)) layer. All layers are formed during the process of forming the metal layers in the BEOL region. The gate G, source S, and drain can be formed by any suitable conductive material, including, for example, polysilicon ("poly"), TiN, W, and Cu. The gate oxide/isolation layer 510 can be made of any suitable material for nonvolatile memory including, for example, ferroelectric materials, such as perovskite, SBT, PZT, HfZrO, and HfO. The semiconductor channel layer 520 can be made of any suitable semiconductor material, including, for example, poly, LTPS, a-Si TFT, IGZO.

In operation, in some embodiments, to write a weight value to a memory cell 430(r, c, l), top and bottom SG(r) for row r are turned on; and the word line WL(r, l) for row r and layer l on the one hand, and global select line GSL(c) and global bit line GBL(c) on the other, are biased to impose a voltage above the threshold voltage for the memory cell 430(r, c, l), while the combinations of biases for the WL, GSL and GBL for all other memory elements 430 in row r do not exceed that threshold voltage for the respective memory cells 430. Next, in some embodiments, all bit lines BL can be pre-charged by applying a precharge voltage to all GBLs while SGs are ON and all memory cells 430 are OFF.

To perform multiply-accumulate ("MAC") operation, in some embodiments, input signals are simultaneously applied to respective word lines WL(r, l) while all SGs are turned ON, and GSLs are biased (e.g., at ground) different from the GBL precharge voltage. Thus, in these embodiments, there will be a bit line current for a given memory cell 430 (r, c, l) if the stored state in the memory cell 430 (r, c, l) corresponds to a binary 1 and the input signal at WL(r, l) corresponds to a binary 1; the bit line current would be 0 in all other cases. The bit line current for each memory cell 430 (r, c, l) is therefore proportional to the product of the input value and the stored weight value. The total current in each one-dimensional array at row r and column c is thus the sum of the products for the one-dimensional array. Moreover, the total current for each global bit line GBL(c) for column c is the sum of all sums the products for the one-dimensional arrays in the column. The total current in each global bit line GBL(c) results in a proportional output voltage at the respective global bit line GBL(c) due to the capacitance of the GBL(c) itself and/or the capacitance of one or more capacitors external to the GBL(c). The output voltage of each global bit line GBL(c) in some embodiments is received by a respective sense amplifier located in the active semiconductor region directly below the global bit line GBL(c) and connected to the global bit line GBL(c).

According to some embodiments, as outlined in FIG. 6, a method 600 of computing includes, storing 610 weight values, one in each of a respective one of a plurality of memory cells (for example, memory cells 430(r,c,l) in FIG. 4) formed at least partially within a set of conductive layers above an active semiconductor layer in an integrated circuit device, the memory cells being arranged in columns sequentially disposed in a first (x) dimension, columns sequentially disposed in a second (y) dimension, and sequentially disposed levels in a third (z) dimension substantially perpendicular to the active semiconductor layer; applying 620 input signals (for example, WL signals WL(r,l) in FIG. 4), each indicative of an input value, to respective memory cells; generating 630 output signals (for example, BL signals BL(r,c) in FIG. 4) from the memory cells, the output signal from each of the memory cells being indicative of a combination of the input values and respective weight values stored in the memory cell; and transmitting 640 the output signals to the active semiconductor layer (for example, via GBL lines in FIG. 4).

Figure 7:
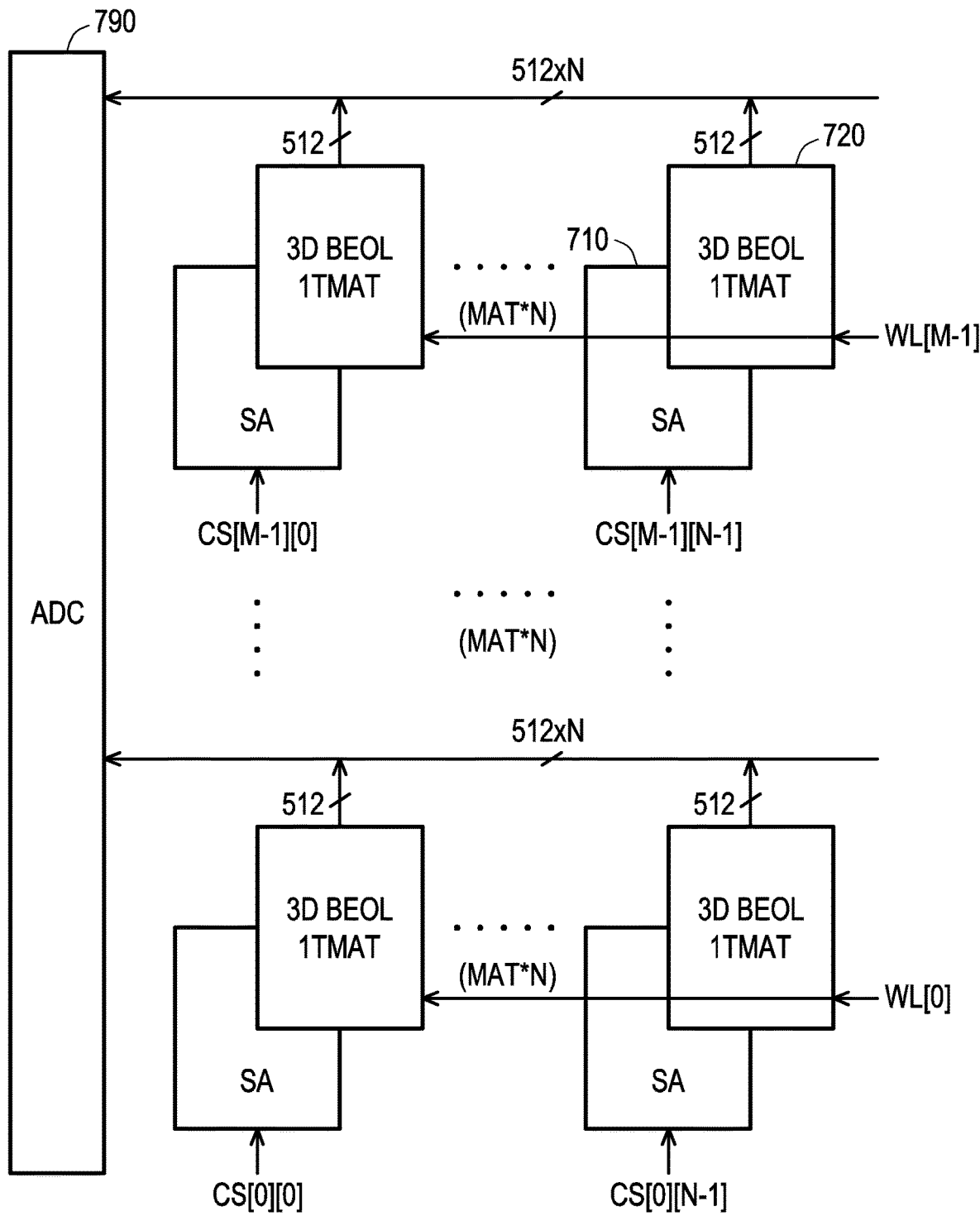
FIG. 7 outlines a method of in-memory computing according to some embodiments.

FIG. 7 schematically shows a two-dimensional arrangement of multiple 3D BEOL memory array modules and corresponding active semiconductor regions used together to simultaneously perform MAC operations in a specific example embodiment. In this example, M rows of N 3D BEOL memory array modules 720 and associated active semiconductor regions (including the respective sense amplifiers) 710 are used. Each 3D BEOL memory array module 720 is a 512-column module in this example, but can have any number of columns. The outputs of the columns (512 in this example) in each memory module 720 are received by the sense amplifier (SA) for the memory module when the respective column-select signal $CS_{mn}$ (where m ranges from 0 to M−1, and n from 0 to N−1) is sent to the SA. The outputs of all memory modules 720, i.e., (number of columns of memory cells in each memory array modules)×M×N (512×M×N in this example) can be received by the respective SA's at the same time. The N outputs each row of memory array modules 720 are combined, and the M combined outputs are sent to an ADC 790, the output of which is a digital result of the MAC computations.

Figure 9:
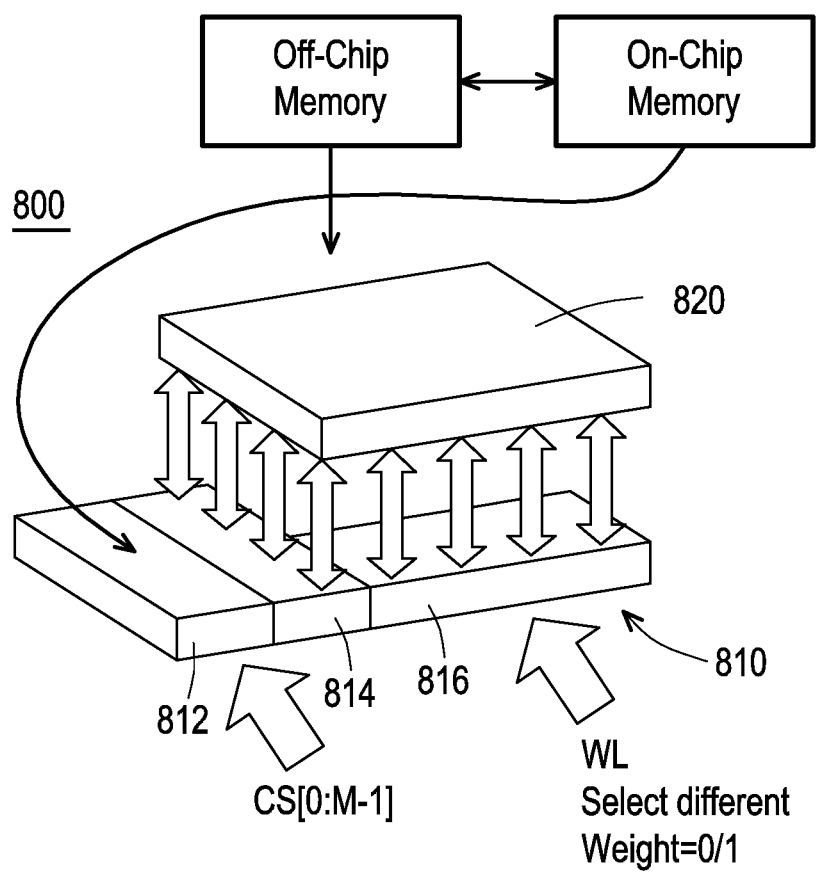
FIG. 9 schematically shows signal and data applied to a BEOL 2D memory array module (such as the one shown in FIG. 8A) positioned above an FEOL circuit according to some embodiments.
Figure 10:
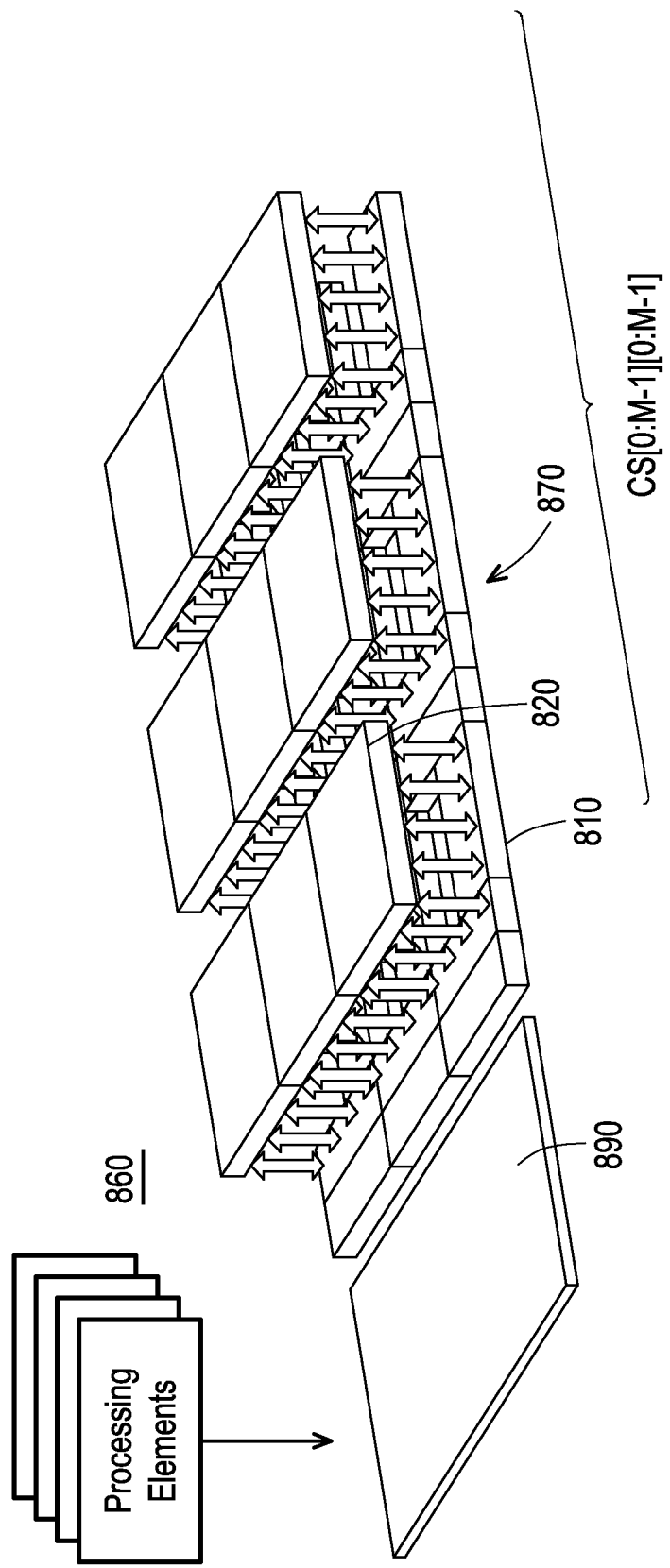
FIG. 10 schematically shows further details of the two-dimensional (2D) array of 2D memory array modules positioned above the 2D array of the respective FEOL circuits in FIG. 8B according to some embodiments.

In some embodiments, instead of 3D memory arrays, as shown, e.g., in FIGS. 1-4, other types of memory arrays than 3D memory arrays can be formed in BEOL layers and above the active semiconductor layer. In the example shown in FIGS. 8A and 9, similar to the integrated circuit device 100 in FIG. 1, the integrated circuit device 800 includes an active semiconductor layer 810 and a memory array 820 formed in a BEOL layer above the active semiconductor layer 810. However, the memory array 820 in this example is not a 3D memory array as in FIG. 1; instead, the memory array 820 includes 2D memory elements (e.g., UHD 1T1C memory cells) arranged in columns and row (not shown). The active semiconductor layer 810 below the memory array in this example includes a column-selector (CS) circuit 812 configured to send signals to the source lines (SLs (see, FIG. 3)), a sense amplifier (SA) 814 connected to the bit lines (BLs) to receive output signals from the memory cells, and a word line (WL) driver 816 to supply weight values to the respective memory cells. As shown in FIGS. 8B and 10, an integrated circuit device 860 can include a two-dimensional array of the integrated circuit device 800 shown in FIG. 8A. The two-dimensional array includes M columns (column 0 through column M−1) by N rows (row 0 through row N−1) of integrated circuit device 800 shown in FIG. 8A. In this example, the active semiconductor layer includes a two-dimensional array 870 of active semiconductor layers 810; a memory array (memory array tile (MAT)) 810 is formed in the BEOL layer above each respective active semiconductor layers 810. The active semiconductor layer 870 further includes one or more analog-to-digital converters (ADC) 190, with inputs from the semiconductor devices in columns of the active semiconductor regions 810.

Figure 11:
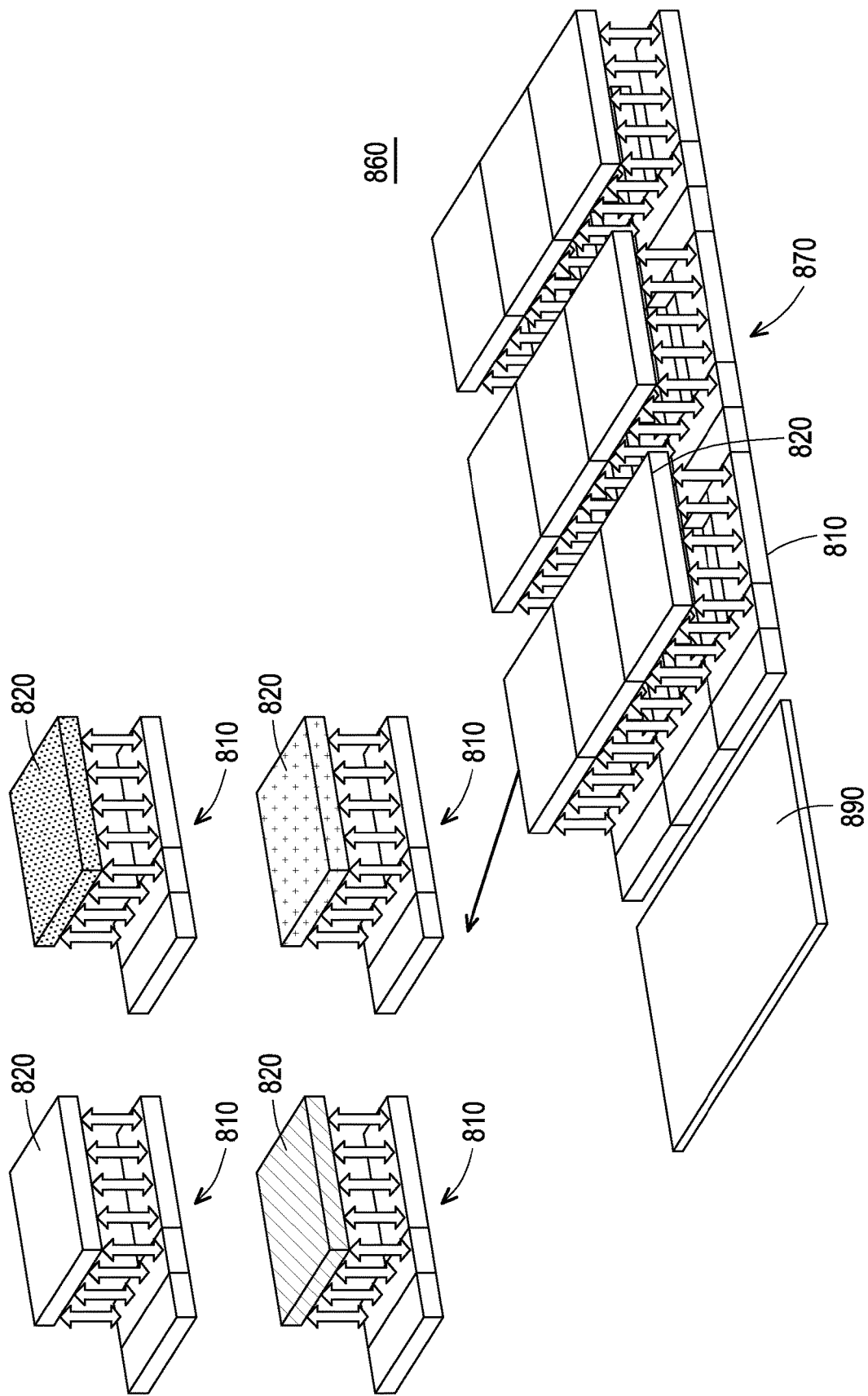
FIG. 11 schematically shows examples of various types of BEOL 2D memory array modules positioned above corresponding FEOL circuits according to some embodiments.

As shown by the examples in FIG. 11, the memory arrays 820 can be any suitable arrays of memory cells, including, for example, 1T1C RAM, resistive RAM (RRAM), magnetic RAM (MRAM), and phase-change RAM (PCRAM).

Figure 12:
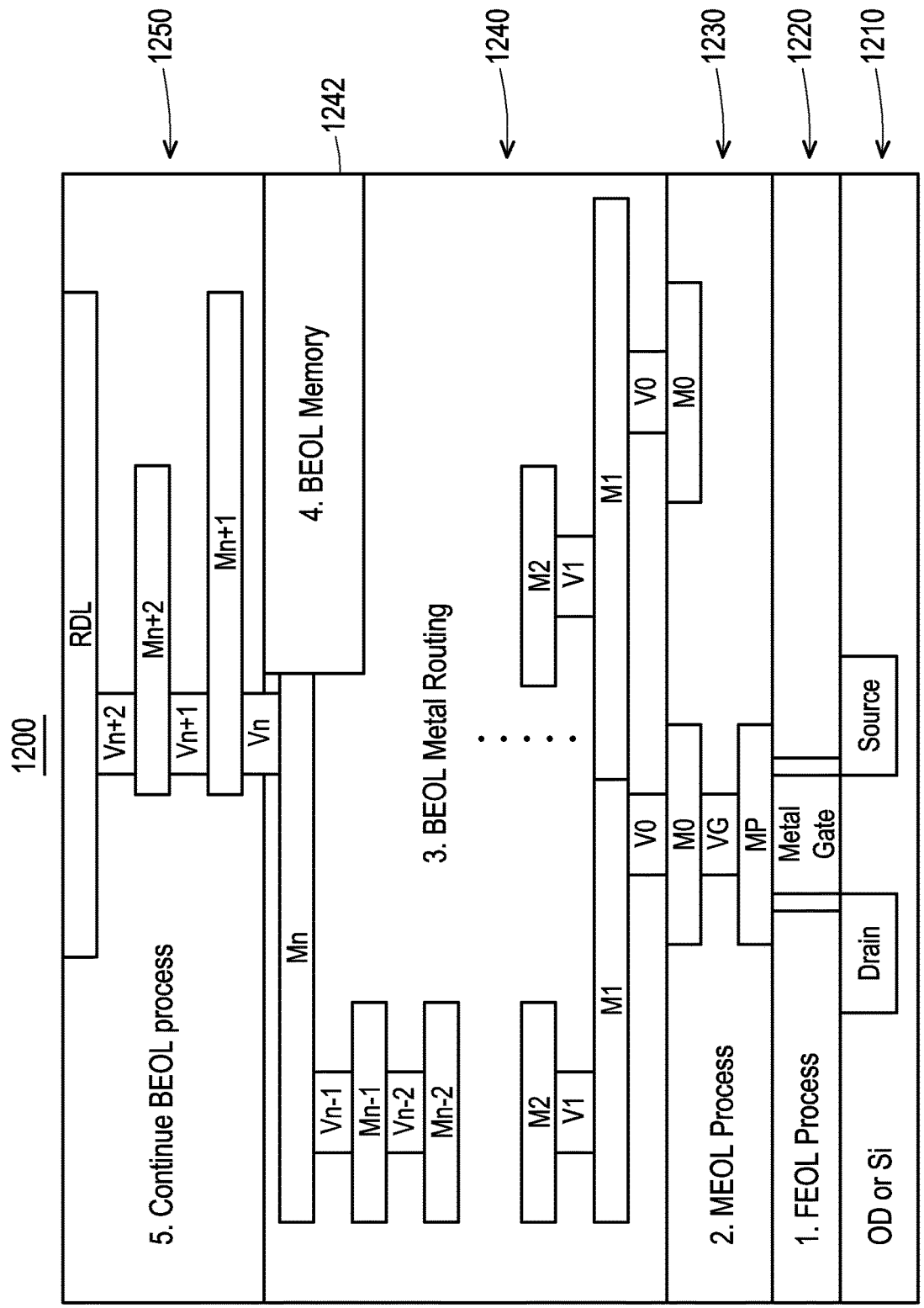
FIG. 12 schematically shows in cross-section an example physical structure of an integrated circuit device including a BEOL memory array module (2D or 3D) positioned above corresponding FEOL circuits according to some embodiments.

FIG. 12 schematically shows an example physical structure of an integrated circuit device 1200. In this example, an active semiconductor layer 1210 includes various semiconductor devices, such as transistors that form amplifiers, drivers and memory cell. An FEOL layer 1220 is formed in an FEOL process on top of the semiconductor layer 1210, and includes metal layers, such as gates of the transistors in the semiconductor layer 1210. Above the FEOL layer is a middle end of the line (MEOL) layer 1230, which can include conductive layers (e.g., metal layers labelled "MP" and "M0", interconnected by conductive pillars (vias) (labelled "VG") interconnecting various semiconductor devices. Above the MEOL layer is a BEOL layer 1240, which can include conductive layers (e.g., M1, M2, . . . , Mn, interconnected by pillars (vias) v1, v2, . . . , v(n−1) and connected to the MEOL layer 1230 by pillars v0). The BEOL layer 1240 in this example further includes memory cells 1242, such as those shown in FIGS. 1 and 8A. The device 1200 in this example further includes an additional BEOL layer 1250, which include further conductive layers M(n+1), M(n+2), and redistribution lines (RDL), interconnected by conductive pillars V(n+1) and V(n+2), and connected to the Mn layer below by conductive pillar Vn.

Figure 13:
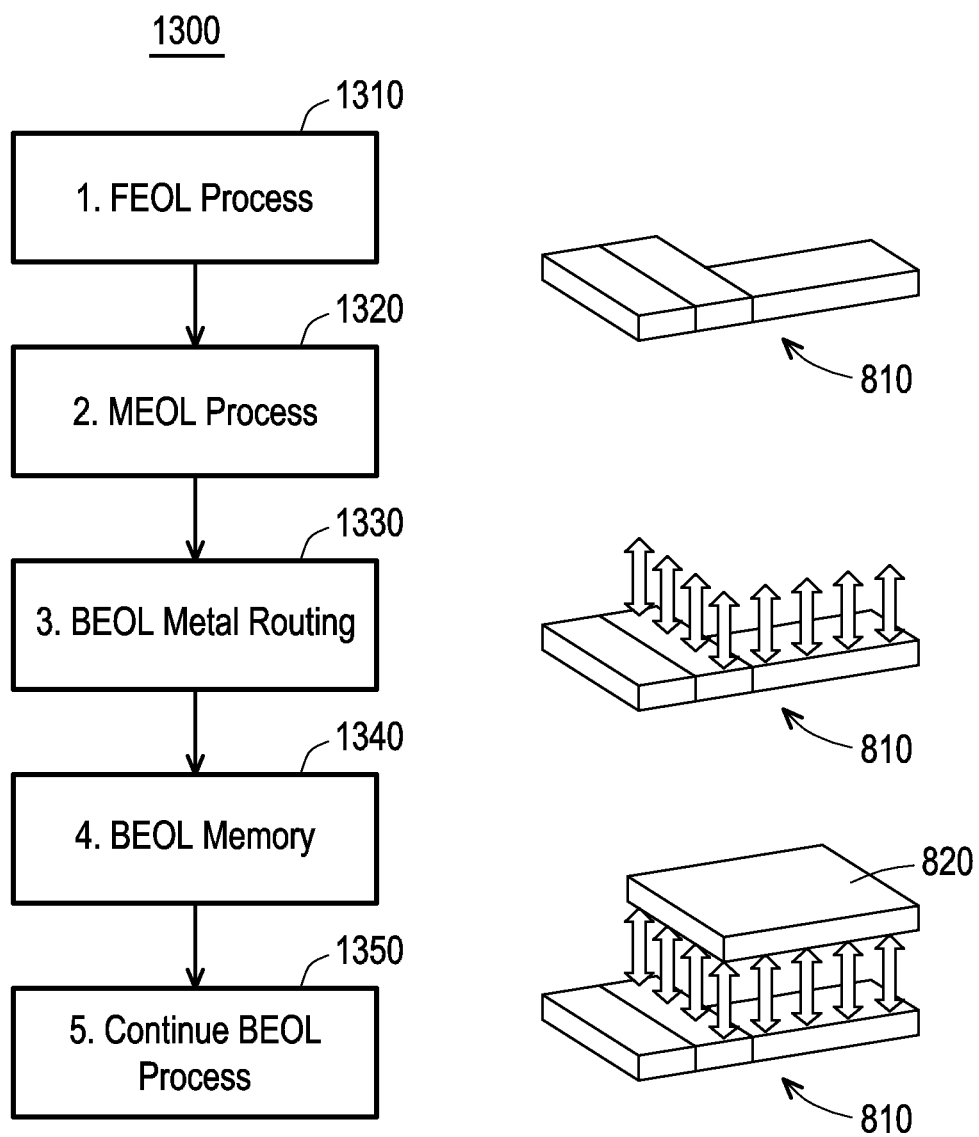
FIG. 13 outlines a process of fabricating an integrated circuit device of a type shown in FIG. 12 according to some embodiments.

In some embodiments the example structure shown in FIG. 12 can be fabricated in a process 1300, outlined in FIG. 13. In the FEOL (1310) and MEOL (1320) processes, semiconductor devices, such as column selectors 812 (in FIG. 8A), sense amplifiers 814 (in FIG. 8A) and word line drivers 816 (in FIG. 8A) are formed. Next, in a BOEL process 1330, devices are interconnected by routing conductive lines (such as those in the layers labelled "M1," "M2," . . . "Mn" in FIG. 12) in the BEOL layer. Next in step 1340, memory cells are formed in the BOEL layer. Finally, in step 1350, the BOEL layer is further constructed to include additional layers of conductive lines (such as those in the layers labelled "Mn+1," "Mn+2," . . . in FIG. 12) to link various parts of the integrated circuit.

By using memory arrays, including very high density three-dimensional memory arrays, in the BEOL regions, with associated sense amplifiers and other circuits, such as ADCs, directly below the memory arrays, memory outputs can be simultaneously supplied to the sense amplifiers and to the ADCs with minimal or no waiting time and/or with very little power. Improved computational capability for in-memory computing can thus be achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A computing device, comprising:
a memory module;
a plurality of data input lines (SL);
a plurality of weight input lines (WL);
a plurality of output lines (BL), wherein:
the memory module includes memory cells arranged in a three-dimensional array extending in a first, second, and third dimensions, each memory cell being directly connected to one of the WLs, one of the SLs, and one of the BLs,
the memory module being adapted to store in each of the memory cells a weight value transmitted from the respective weight input lines, receive input signals from the input lines, and simultaneously output signals to the BLs;

a circuitry extending in the first and second dimensions, disposed below the memory module in the third dimension, and adapted to receive from the memory module signals indicative of the signals outputted to the BLs; and one or more analog-to-digital converters (ADCs) having inputs connected to outputs of respective ones of the sense amplifiers.

2. The computing device of claim 1, wherein each of the memory cells includes a one-transistor (IT) memory cell.

3. The computing device of claim 1, wherein each of the memory cells includes ferroelectric random-access memory (FeRAM) element.

4. The computing device of claim 1, further comprising an active semiconductor layer of an integrated circuit (IC) device, the active semiconductor layer comprising a plurality of semiconductor devices, wherein the circuitry is formed from at least a subset of the semiconductor devices, and the memory module is formed in conductive layers above the active semiconductor layer of the integrated circuit device, the conductive layers each comprising conductive lines, at least one of the conductive lines in at least one of the conductive layers interconnecting at least some of the semiconducting devices.

5. The computing device of claim 1, wherein:
the WLs extend in the second dimension and are distributed in the first and third dimensions; and
the BLs and SLs extend in the third dimension and are distributed in the first and second dimensions.

6. The computing device of claim 4, wherein the circuitry comprises a plurality of sense amplifiers, each having an input connected to a respectively one of the BLs, and an output.

7. The computing device of claim 4, wherein the memory cells in the memory module are arranged in one-dimensional arrays extending in the third dimension, each memory cell being located at a level in the third dimension, the one-dimensional arrays being arranged in columns in the first dimension and rows in the second dimension, the memory cells in each of the one-dimensional arrays being commonly connected to a respective one of the SLs and a respective one of the BLs, and the memory cells in the same row and level being commonly connected to a respective one of the WLs.

8. The computing device of claim 7, further comprising:
a first plurality of global bit select lines (GSLs); and
a plurality of first switching transistors, each associated with a respective one of the SLs and adapted to switchably connect the associated SL to a respective one of the first plurality of GSLs, wherein the first switching transistors associated with the respective SLs in same column are adapted to switchably connect the associated SLs to the same GSL.

9. The computing device of claim 8, further comprising:
a second plurality of global bit select lines (GBLs); and
a plurality of second switching transistors, each associated with a respective one of the BLs and adapted to switchably connect the BL to a respective one of the second plurality of GBLs, wherein the second switching transistors associated with the respective BLs in same column are adapted to switchably connect the associated BLs to the same GBL.

10. The computing device of claim 8, wherein each of the first switching transistors have a gate, source and drain, wherein the gates of the first switching transistors associated with the same row of SLs are commonly connected to a first select gate line (SG).

11. The computing device of claim 9, wherein each of the second switching transistors have a gate, source and drain, wherein the gates of the second switching transistors associated with the same row of BLs are commonly connected to a second select gate line (SG).

12. A computing device, comprising:
a substrate;
an active semiconductor layer formed on the substrate;
a plurality of semiconductor devices formed in the active semiconductor layer; and
a memory module formed above the active semiconductor layer and comprising:
a plurality of memory cells arranged in columns sequentially disposed in a first dimension, rows sequentially disposed in a second dimension, and levels sequentially disposed in a third dimension, the first and second dimensions being substantially parallel to the active semiconductor layer, and the third dimension being substantially perpendicular to the active semiconductor layer;
a plurality of word lines (WLs), each connected to a subset of the plurality of memory cells disposed in the same row and level;
a plurality of global source lines (GSLs), each switchably connected to a subset of the plurality of memory cells disposed in the same column and row, the subset of the plurality of memory cells disposed in the same column and row being directly connected to each other;
a plurality of global bit lines (GBLs), each switchably connected to the subset of the plurality of memory cells connected to a respective one of the GSLs, the plurality of GBLs being connected to respective ones of semiconductor devices;
one or more analog-to-digital converters (ADCs) formed within the active semiconductor layer and having a plurality of inputs, wherein each of the plurality of semiconductor devices comprises a sense amplifier, each of the ADCs being configured to receive signals from a respective one of the plurality of sense amplifiers.

13. The computing device claim 12, further comprising a plurality of conductive layers formed above the substrate, each of the plurality of conductive layers including one or more conductive lines, wherein at least a portion of the memory module is formed within the plurality of conductive layers, the conductive layers comprising conductive lines, at least one of the conductive lines in at least one of the conductive layers interconnecting at least some of the semiconducting devices.

14. The computing device of claim 12, wherein each of the plurality of memory cells comprises a single-transistor memory having a gate, source and drain, wherein each of the WLs is connected to the respective subset of memory cells at the gates of the memory cells, each of the GSLs is switchably connected to the respective subset of memory cells at the sources of the memory cells, and each of the GBLs is switchably connected to the respective subset of memory cells at the drains of the memory cells.

15. The computing device of claim 14, further comprising:
a plurality of first switching transistors, each having a gate, source and drain, wherein each of the GSLs is switchably connected to the respective subset of memory cells via the source and drain of a respective one of the plurality of first switching transistors;

a plurality of second switching transistors, each having a gate, source and drain, wherein each of the GBLs is switchably connected to the respective subset of memory cells via the source and drain of a respective one of the plurality of second switching transistors.

16. The computing device of claim 15, wherein the gates of the first switching transistors associated with the same row of SLs are commonly connected to a first select gate line (SG).

17. A method of computing, comprising:

storing a plurality of weight values, one in each of a respective one of a plurality of memory cells formed at least partially within a plurality of conductive layers above an active semiconductor layer in an integrated circuit device, the memory cells being arranged in columns sequentially disposed in a first dimension, rows sequentially disposed in a second dimension, and sequentially disposed levels in a third dimension, the first and second dimensions being substantially parallel to the active semiconductor layer, and the third dimension being substantially perpendicular to the active semiconductor layer;

applying a plurality of input signals, each indicative of an input value, to respective ones of the plurality of memory cells;

generating output signals from the plurality of memory cells, the output signal from each of the memory cells being indicative of a combination of the input values and respective weight values stored in the memory cell, the generating output signals from the plurality of memory cells comprising generating output signals from each subset of the memory cells in the same column and row to a signal line directly connected to each of the subset of the memory cells;

transmitting the output signals to the active semiconductor layer; and generating analog output signals from the sense amplifiers and converting the analog output signal to respective digital signals using one or more analog-to-digital converters (ADCs) formed in the active semiconductor layer.

18. The method of claim 17, wherein transmitting the output signals to the active semiconductor layer comprises combining the outputs of a subset of the plurality of memory cells in each column and transmitting the combined signal to a respective sense amplifier in the active semiconductor layer.

19. The method of claim 18, wherein the output signal from each of the memory cells is indicative of a product of the input value and respective weight value stored in the respective memory cell, and the generating output signals from the plurality of memory cells comprises generating output currents from each subset of the memory cells in the same column and row and combining the output currents into a signal line directly connected to each of the subset of the memory cells.

20. The computing device of claim 17, wherein each of the second switching transistors have a gate, source and drain, wherein the gates of the second switching transistors associated with the same row of BLs are commonly connected to a second select gate line (SG).

* * * * *